US012768896B2

(12) United States Patent
Ryba et al.

(10) Patent No.: US 12,768,896 B2
(45) Date of Patent: Oct. 20, 2026

(54) ELECTROCHEMICAL IMPEDANCE SPECTROSCOPY MEASURING DEVICE AND METHOD

(71) Applicant: STMICROELECTRONICS INTERNATIONAL N.V., Geneva (CH)

(72) Inventors: Jiri Ryba, Prague (CZ); Vittorio D'Angelo, Nocera Superiore (IT); Salvatore Cannavacciuolo, Villaricca (IT); Mario Di Guardo, Sant'Agata li Battiati (IT); Piero Coletta, Paupisi (IT)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 159 days.

(21) Appl. No.: 18/742,574

(22) Filed: Jun. 13, 2024

(65) Prior Publication Data

US 2025/0004063 A1 Jan. 2, 2025

(30) Foreign Application Priority Data

Jun. 30, 2023 (EP) .................................... 23182628

(51) Int. Cl.
*G01R 31/389* (2019.01)
*G01R 31/3835* (2019.01)
(Continued)

(52) U.S. Cl.
CPC ....... *G01R 31/389* (2019.01); *G01R 31/3835* (2019.01); *G01R 31/392* (2019.01); *H02J 7/82* (2026.01); *H02J 7/84* (2026.01)

(58) Field of Classification Search
CPC .................................................... G01R 31/396
See application file for complete search history.

(56) References Cited

U.S. PATENT DOCUMENTS 10,180,460 B1 * 1/2019 Castelaz ................. B60L 58/16
2021/0333328 A1 * 10/2021 Chung ................ H01M 10/482

OTHER PUBLICATIONS

Carbonnier et al., "Electrochemical Impedance Spectroscopy for Online Satellite Battery Monitoring Using Square Wave Excitation," 2019 European Space Power Conference (ESPC). IEEE, (2019).

(Continued)

*Primary Examiner* — Tung X Nguyen
(74) *Attorney, Agent, or Firm* — Alston & Bird LLP

(57) ABSTRACT

The present disclosure relates to an EIS measuring device comprising: an electrical energy storage circuit; an electronic circuit coupled to the electrical energy storage circuit and configured to be coupled to a battery whose impedance is to be measured by the EIS measuring device, a characterization circuit configured to measure an alternative current intended to circulate between the battery and the electronic circuit, and a voltage at terminals of the battery; wherein the electronic circuit is alternately configured in a first mode to pull out electrical energy of the battery and storing the electrical energy pulled-out from the battery in the electrical energy storage circuit, and in a second mode to pull out the stored electrical energy from the electrical energy storage circuit and to re-inject the electrical energy pulled-out from the electrical energy storage circuit in the battery.

13 Claims, 3 Drawing Sheets

(51) Int. Cl.

| | |
|---|---|
| ***G01R 31/392*** | (2019.01) |
| ***H02J 7/82*** | (2026.01) |
| ***H02J 7/84*** | (2026.01) |

(56) References Cited

OTHER PUBLICATIONS

Cuadras et al., "SoC Li-ion Battery Monitoring With Impedance Spectroscopy," 2009 6th International Multi-Conference on Systems, Signals and Devices, doi: 10.1109/SSD.2009.4956761, (Apr. 2009).

* cited by examiner a)

b)

c)

ELECTROCHEMICAL IMPEDANCE SPECTROSCOPY MEASURING DEVICE AND METHOD

CROSS REFERENCE TO RELATED APPLICATIONS

This application claims the priority benefit of European Patent Application Number 23182628.0, filed on Jun. 30, 2023, entitled "Electrochemical Impedance Spectroscopy Measuring Device and Method", which is hereby incorporated by reference to the maximum extent allowable by law.

TECHNICAL FIELD

The present disclosure relates generally to characterization of a battery by Electrochemical Impedance Spectroscopy (EIS).

BACKGROUND

The demand for battery storage is increasing in many applications and precise parameter estimation of batteries is essential for optimal usage of the remaining battery capacities.

Frequency domain impedance of batteries contain valuable information, e.g. about the state of charge (SOC) and the state of health (SOH).

Using EIS, the frequency domain impedance of the battery, defined as $Z(j\omega)$ for a frequency f equal to $\omega/2\pi$, can be measured by applying an excitation signal having a frequency f and using either an external voltage source coupled to a charger of the battery, or a boost converter loaded with a resistor. However, these solutions involve several drawbacks.

BRIEF SUMMARY

There is a need to propose an alternative solution to characterize a battery by EIS without the drawbacks of the previously described EIS measurement solutions.

One embodiment addresses all or some of these drawbacks and proposes an EIS measuring device comprising at least:

- an electrical energy storage circuit;
- an electronic circuit coupled to the electrical energy storage circuit and configured to be coupled to a battery whose impedance is intended to be measured by the EIS measuring device,
- a characterization circuit configured at least to measure an alternative current intended to circulate between the battery and the electronic circuit, and to measure a voltage at terminals of the battery;
- wherein the electronic circuit is alternately configured in a first mode to pull out electrical energy of the battery and storing the electrical energy pulled-out from the battery in the electrical energy storage circuit, and in a second mode to pull out the stored electrical energy from the electrical energy storage circuit and to re-inject the electrical energy pulled-out from the electrical energy storage circuit in the battery.

According to an embodiment, the electronic circuit is configured to circulate, in the first mode, a charge current from the battery to the electrical energy storage circuit, and to circulate, in the second mode, a discharge current from the electrical energy storage circuit to the battery, the charge and discharge currents together forming the alternative current.

According to an embodiment, the alternative current corresponds to a modulated signal having a sinusoidal envelope.

According to an embodiment, the characterization circuit comprises a calculator configured to calculate an impedance value, at a frequency of the alternative current, of the battery corresponding to a ratio between the measured voltage at terminals of the battery and the measured current intended to circulate between the battery and the electronic circuit.

According to an embodiment, the calculator of the characterization circuit is also configured to determine a state of charge and/or a state of health of the battery from the calculated impedance value of the battery.

According to an embodiment, the electronic circuit comprises at least:

- first and second transistors coupled one to the other such that a first electrode of the first transistor is coupled to a first electrode of the second transistor, a second electrode of the first transistor being configured to be coupled to a first terminal of the battery and to a first terminal of the electrical energy storage circuit, and a second electrode of the second transistor being configured to be coupled to a second terminal of the electrical energy storage circuit, the first and second electrodes of each of the first and second transistors corresponding either to the source and drain, or to the drain and the source, of said each of the first and second transistors;
- an inductor having a first terminal coupled to the first electrodes of the first and second transistors, and a second terminal configured to be coupled to a second terminal of the battery.

According to an embodiment, the first and second transistors are of the MOSFET type.

According to an embodiment, the electronic circuit further comprises a control circuit configured to apply, when the first and second transistors are of opposite conductivity types, a single gate control signal on gates of the first and second transistors, or to apply, when the first and second transistors are of the same conductivity type, a first gate control signal on the gate of the first transistor and a second gate control signal, which is complementary to the first gate control signal, on the gate of the second transistor.

According to an embodiment, the single gate control signal is a PWM (Pulse Width Modulation) signal, or the first and second gate control signals are PWM signals.

According to an embodiment, the electrical energy storage circuit comprises at least one capacitor.

According to an embodiment, the characterization circuit comprises a shunt resistor having a first terminal coupled to the electronic circuit and a second terminal configured to be coupled to the battery.

Another embodiment corresponds to an EIS measuring method comprising at least the steps of:

- coupling at least one cell of a battery to an EIS measuring device as disclosed above;
- configuring the electronic circuit of the EIS measuring device alternately in the first and second modes;
- measuring the current circulating between said at least one cell of the battery and the electronic circuit, and measuring the voltage at terminals of said at least one cell of the battery.

According to an embodiment:

the battery comprises several cells serially connected one to the other;

the voltage is measured at terminals of the battery;

the current circulating between the battery and the electronic circuit corresponds to a current circulating through said several cells.

According to an embodiment:

the battery comprises several cells serially connected one to the other;

the steps of the EIS measuring method are applied successively to each cell of the battery.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
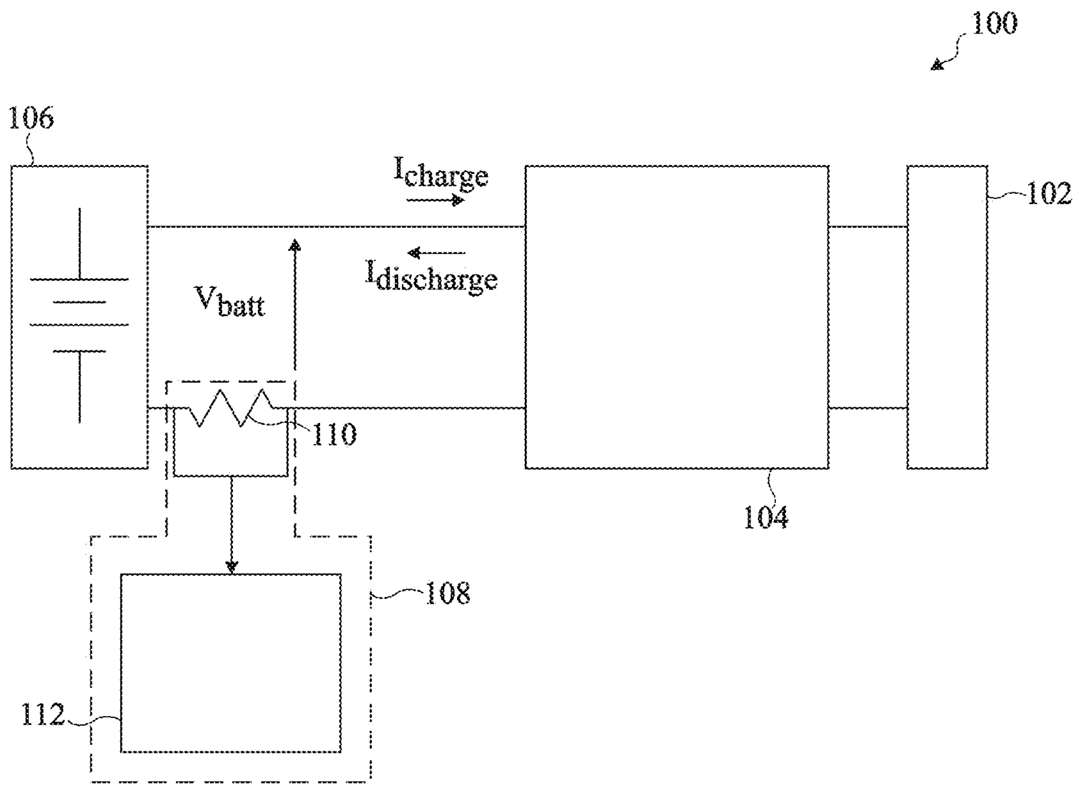
FIG. 1 illustrates schematically an EIS measuring device according to one embodiment.

Like features have been designated by like references in the various figures. In particular, the structural and/or functional features are that common among the various embodiments may have the same references and may dispose identical structural, dimensional and material properties.

For the sake of clarity, only the operations and elements that are useful for an understanding of the embodiments described herein have been illustrated and described in detail. In particular, different elements (electrical energy storage circuit, electronic circuit, characterization circuit, etc.) of the described EIS measuring devices have not been detailed. Detailed implementation of these elements is within the capabilities of those skilled in the art based on the functional description provided hereinabove.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

In all the document, the term "battery" may be understand as corresponding to one battery cell or to several battery cells connected one to the other.

An example embodiment of an EIS measuring device 100 is described below in relation with FIG. 1.

The EIS measuring device 100 comprises an electrical energy storage circuit 102. For example, the electrical energy storage circuit 102 may correspond to at least one capacitor. More generally, the electrical energy storage circuit 102 may correspond to any other component or circuit able to temporary store electrical energy.

The EIS measuring device 100 also comprises an electronic circuit 104 coupled to the electrical energy storage circuit 102 and configured to be coupled to a battery 106 whose impedance is intended to be measured by the EIS measuring device 100. In the example embodiment shown in FIG. 1, the electronic circuit 104 comprises two terminals coupled to two terminals of the battery 106.

The EIS measuring device 100 also comprises a characterization circuit 108 configured at least to measure an alternative current $I(\omega)$ intended to circulate between the battery 106 and the electronic circuit 104, and to measure a voltage $V_{batt}(\omega)$ at terminals of the battery 106.

In the example embodiment shown in FIG. 1, the characterization circuit 108 comprises a shunt resistor 110 which is used to measure the current $I(\omega)$ circulating between the battery 106 and the electronic circuit 104. In this example embodiment, the shunt resistor 110 has a first terminal coupled to the electronic circuit 104 and a second terminal coupled to the battery 106.

In the example embodiment shown in FIG. 1, the characterization circuit 108 also comprises a calculator 112 configured to calculate an impedance value $Z(\omega)$ of the battery 106 corresponding to a ratio between the measured voltage $V_{batt}(\omega)$ at terminals of the battery 106 and the measured current $I(\omega)$ intended to circulate between the battery 106 and the electronic circuit 104. A phase difference $\varphi$ between measured voltage $V_{batt}(\omega)$ and the measured current $I(\omega)$ is also considered, and in this case, the impedance of the battery 106 is expressed by the following equation: $Z(j\omega)=|Z(j\omega)|e^{J\varphi\omega}$.

Advantageously, the calculator of 112 the characterization circuit 108 may calculate one or several characterizing features of the battery 106. For example, from the calculated impedance value $Z(j\omega)$ of the battery 106, the calculator 112 may be configured to calculate and determine a state of charge (SOC) and/or a state of health (SOH) of the battery 106. Other characterizing features of the battery 106 may be calculated by the calculator 112.

The electronic circuit 104 is configured to be alternately in a first mode, also named boost mode, to pull out electrical energy of the battery 106 and storing the electrical energy pulled-out from the battery 106 in the electrical energy storage circuit 102, and in a second mode, also named buck mode, to pull out the electrical stored energy from the electrical energy storage circuit 102 and to re-inject the energy pulled-out from the electrical energy storage circuit 102 in the battery 106.

In an advantageous embodiment, the electronic circuit 104 is configured to circulate, in the first mode, a charge current from the battery 106 to the electrical energy storage circuit 102, and to circulate, in the second mode, a discharge current from the electrical energy storage circuit 102 to the battery 106. In FIG. 1, the charge current is symbolically represented by a first arrow and named "$I_{charge}$", and the discharge current is symbolically represented by a second arrow and named "$I_{discharge}$". The charge and discharge currents together form the alternative current $I(\omega)$. In order to obtain this alternation of the flow direction of the current between the battery 106 and the electronic circuit 104, the alternative current may correspond to a modulated signal having a sinusoidal envelope.

An example embodiment of the electronic circuit 104 and the electrical energy storage circuit 102 of the EIS measurement device 100 is described below in relation with FIG. 2.

Figure 2:
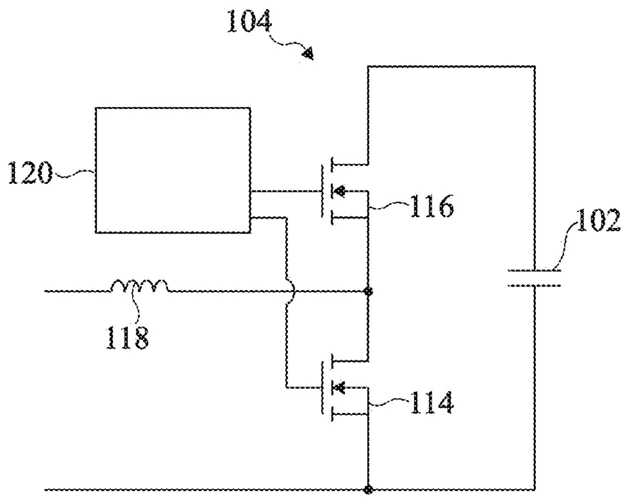
FIG. 2 illustrates schematically an example embodiment of an electronic circuit and an electrical energy storage circuit of an EIS measurement device according to one embodiment.

In the example embodiment shown in FIG. 2, the electrical energy storage circuit 102 comprises one capacitor. Alternately, the EIS measurement device 100 may comprise other type of electrical energy storage capacitor 102.

In the example embodiment shown in FIG. 2, the electronic circuit 104 comprises at least a first transistor 114 and at least a second transistor 116 together forming a totem pole. The first and second transistors 114, 116 are coupled one to the other such that a first electrode of the first transistor 114 is coupled to a first electrode of the second transistor 116. A second electrode of the first transistor 114 is coupled to a first of the two terminals of the battery 106 and to a first terminal of the electrical energy storage circuit 102. A second electrode of the second transistor 116 is coupled to a second terminal of the electrical energy storage circuit 102.

Advantageously, the first and second transistors 114, 116 are of the MOSFET type. In this case, the first and second electrodes of each of the first and second transistors 114, 116 correspond either to the source and drain, or to the drain and the source, of said each of the first and second transistors 114, 116, according to the conductivity of the first and second transistors 114, 116. In the example embodiment shown in FIG. 2, the first and second transistors 114, 116 are N-MOSFET. In this configuration, the first electrode of the first transistor 114 corresponds to the drain of the first transistor 114, the first electrode of the second transistor 116 corresponds to the source of the second transistor 116, the second electrode of the first transistor 114 corresponds to the source of the first transistor 114, and the second electrode of the second transistor 116 corresponds to the drain of the second transistor 116.

In alternative embodiments, it is possible that the first and second transistors 114, 116 are P-MOSFET, or that the first transistor 114 is N-MOSFET and that the second transistor 116 is P-MOSFET, or that the first transistor 114 is P-MOSFET and that the second transistor 116 is N-MOSFET.

In the example embodiment shown in FIG. 2, the electronic circuit 104 also comprises an inductor 118 having a first terminal coupled to the first electrodes of the first and second transistors 114, 116, and a second terminal coupled to a second of the two terminals of the battery 106.

With the electronic circuit 104 comprising the first and second transistors 114, 116 corresponding to MOSFET, the circulation of the current between the electronic circuit 104 and the battery 106 is controlled by applying adapted control gate signals on gates of the first and second transistors 114, 116.

The electronic circuit 104 further comprises a control circuit 120 configured to apply, when the first and second transistors 114, 116 are of opposite conductivity types, a single gate control signal on gates of the first and second transistors 114, 116, or to apply, when the first and second transistors 114, 116 are of the same conductivity type, a first gate control signal on the gate of the first transistor 114 and a second gate control signal, which is complementary to the first gate control signal, on the gate of the second transistor 116.

The single gate control signal applied on gates of may be a PWM signal, or the first and second gate control signals may be PWM signals. An example of such PWM signal applied on gates of the first and second transistors 114, 116 is shown in FIG. 3*a*). Alternately, modulations different than PWM may be used for the gate control signal(s).

The frequency of the alternative current I(ω) may be between 100 Hz and 5 kHz. Other frequencies are however possible. The frequency of the PWM signal(s), i.e. the switching frequency or the carrier frequency, is higher than the frequency of the alternative current I(ω), and for example be between 30 kHz and 100 KHz.

Applying the PWM signals shown in FIG. 3*a*) on gates of the first and second transistors 114, 116 creates the alternative current I(ω), named "i(t)" in FIGS. 3*b*) and 3*c*), circulating between the battery 106 and the electronic circuit 104. In the example embodiment here described, the alternative current I(ω) corresponds to the charge current $I_{charge}$ when the amplitude of I(ω) is positive, and it corresponds to the discharge current $I_{discharge}$ when the amplitude of I(ω) is negative. An example of the alternative current I(ω) is shown in FIGS. 3*b*) and 3*c*), wherein it comprises a sinusoidal shape. The corresponding voltage $V_{batt}(\omega)$ obtained at terminals of the battery 106 is shown in FIG. 3*c*) wherein this voltage is named $V(t)_{batt}$.

Figure 3:
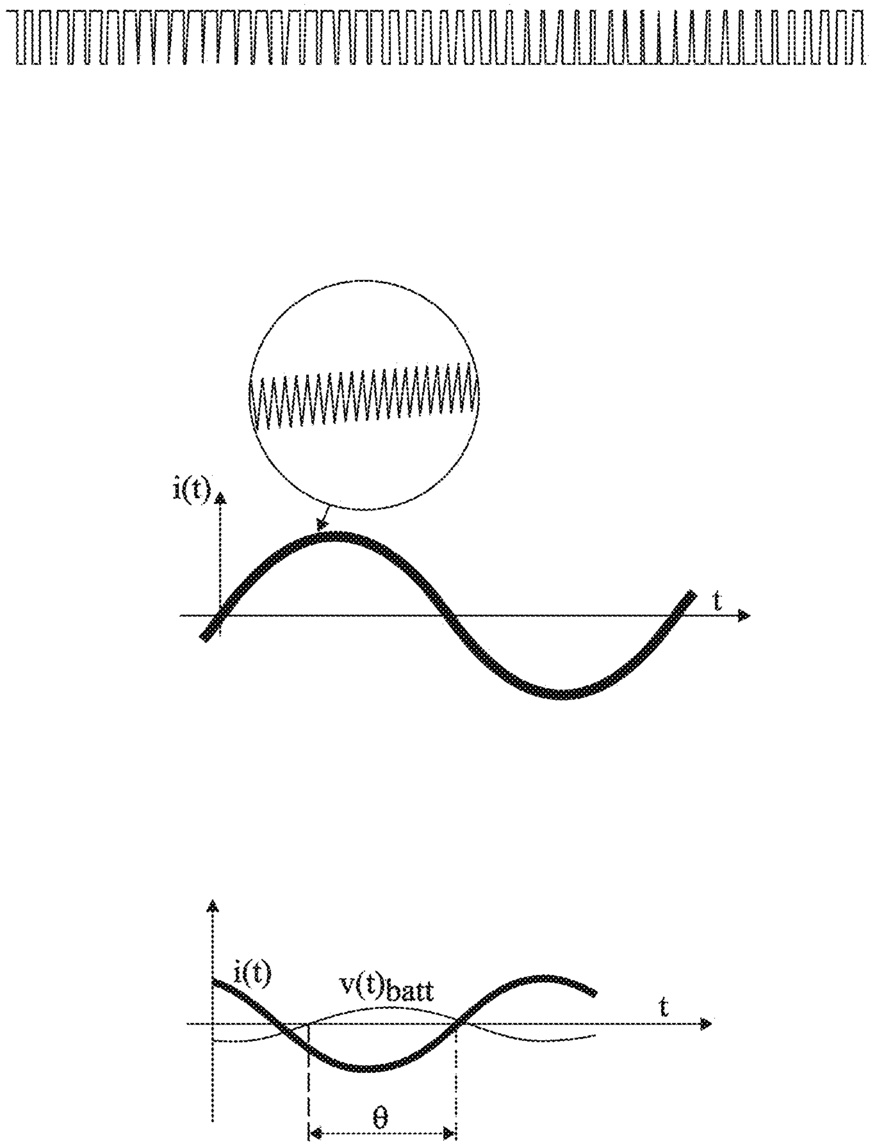
FIG. 3 illustrates signals used and obtained in an EIS measurement device according to one embodiment.

In the approach described in relation with FIG. 3, a sinusoidal envelop at variable frequency is obtained by means of PWM control gate signal(s). However, different PWM generation techniques may lead to different shapes of the alternative current, e.g. more complex shapes, enabling the analysis of more than one frequency per measurement sweep.

The circulation of the alternative current between the battery 106 and the electronic circuit 104 alternately pull out electrical energy of the battery 106 which is thus stored in the electrical energy storage circuit 102, and then pull out the stored electrical energy from the electrical energy storage circuit 102 which is thus re-injected in the battery 106.

The current I(ω) and the voltage $V_{batt}(\omega)$ are measured (advantageously once periodic steady state regime is reached, i.e. few milliseconds, depending on the features of the electrical energy storage circuit 102, the inductor 118 and the frequency of the PWM control pattern) by the characterization circuit 108. The calculator 112 then calculates the frequency domain impedance value Z(jω) value of the battery 106 which corresponds to the ratio between the measured voltage $V_{batt}(\omega)$ and the measured current I(ω). As previously explained, one or several other characterizing features of the battery 106, like SOC and/or SOH, may be calculated by the calculator 112. Algorithms known from those skilled in the art may be used to determine the SOH and/or SOC from the obtained impedance values.

Figure 4:
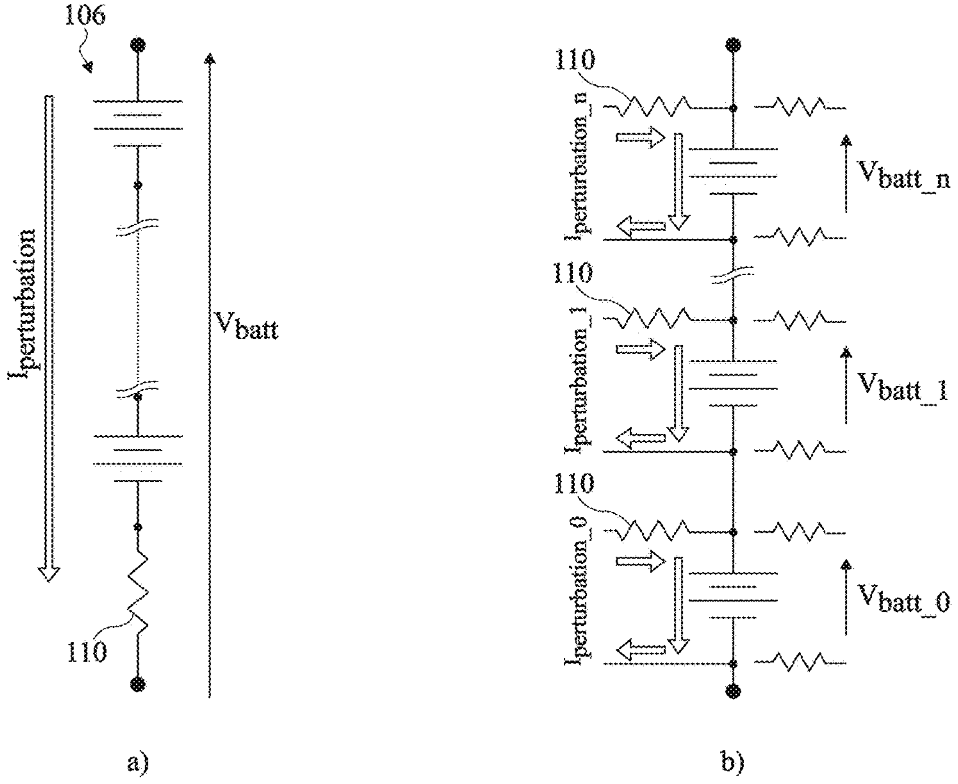
FIG. 4 illustrates different possible uses of an EIS measurement device according to one embodiment.

In the previously exposed embodiment, the EIS measuring device 100 is used to characterize the battery 106. This configuration is schematically shown in FIG. 4*a*), wherein the measured voltage $V_{batt}$ correspond to the voltage measured between the ends of the serially connected cells of the battery 106. Alternately, it may be possible to measure voltages at terminals of each cells or of group of cells, and then add these measured voltages to obtain $V_{batt}$.

In another configuration shown in FIG. 4*b*), the EIS measuring device 100 is used to characterize separately each cell of the battery 106. When the battery 106 comprises n cells, the frequency domain impedance $Z_i(\omega)$, with i integer between 0 and n, of each of the n cells is determined from the alternative current circulating between said each of the n cells and the electronic circuit 104 (in FIG. 4*b*), the perturbation currents of the different cells are named $I_{perturbation\_0}, I_{perturbation\_1}, \ldots, I_{perturbation\_n}$) and from the voltage $V_{batt\_0}, V_{batt\_1}, \ldots, V_{batt\_n}$ measured at terminals of each cells. The measured impedances $Z_i(\omega)$ may then be combined to obtain the global frequency domain impedance of the battery 106.

In another configuration, the EIS measuring device 100 may be used to characterize a battery comprising several cells coupled serially and/or in parallel one to the other, or several groups of cells coupled serially and/or in parallel one to the other.

In the previously exposed EIS measuring device 100, the average energy involved is almost zero (except the losses due to the efficiency of the conversion which is very high). The average value of perturbation current $I_{perturbation}$ which can be expressed as being $I_{perturbation}=I_{charge}+I_{discharge}$, over a measurement period (charge phase+discharge phase) is null. The net exchanged energy in despite of losses is nearly zero, with improved efficiency. In addition, the EIS measuring device 100 is not deeply dissipative and does not need an external energy source or a certain amount of energy sunk from the battery cells.

The EIS measuring device 100 may be advantageously used for the automotive or industrial battery management, e.g. to characterize electric vehicle battery, industrial battery or tools battery, and in particular for Li-ion batteries. Other applications of the EIS measuring device 100 are possible.

Various embodiments and variants have been described. Those skilled in the art will understand that certain features of these embodiments can be combined and other variants will readily occur to those skilled in the art.

The invention claimed is:

1. An EIS measuring device comprising:

an electrical energy storage circuit;

an electronic circuit coupled to the electrical energy storage circuit and configured to be coupled to a battery whose impedance is intended to be measured by the EIS measuring device;

a characterization circuit configured at least to measure an alternative current intended to circulate between the battery and the electronic circuit and to measure a voltage at terminals of the battery;

wherein the electronic circuit is alternately configured in a first mode to pull out electrical energy of the battery and to store the electrical energy from the battery in the electrical energy storage circuit, and in a second mode to pull out stored electrical energy from the electrical energy storage circuit and to re-inject the electrical energy from the electrical energy storage circuit in the battery; and wherein the electronic circuit comprises:

a first transistor and a second transistor coupled one to the other such that a first electrode of the first transistor is coupled to a first electrode of the second transistor, a second electrode of the first transistor being configured to be coupled to a first terminal of the battery and to a first terminal of the electrical energy storage circuit, and a second electrode of the second transistor being configured to be coupled to a second terminal of the electrical energy storage circuit, the first and second electrodes of each of the first and second transistors corresponding either to a source and a drain or to the drain and the source of each of the first transistor and the second transistor; and an inductor having a first terminal coupled to the first electrodes of the first and second transistors, and a second terminal configured to be coupled to a second terminal of the battery.

2. The EIS measuring device of claim 1, wherein the electronic circuit is configured to circulate, in the first mode, a charge current from the battery to the electrical energy storage circuit, and to circulate, in the second mode, a discharge current from the electrical energy storage circuit to the battery, the charge current and the discharge current together forming the alternative current.

3. The EIS measuring device of claim 2, wherein the alternative current corresponds to a modulated signal having a sinusoidal envelope.

4. The EIS measuring device of claim 1, wherein the characterization circuit comprises a calculator configured to calculate an impedance value at a frequency of the alternative current of the battery corresponding to a ratio between a measured voltage at terminals of the battery and a measured current intended to circulate between the battery and the electronic circuit.

5. The EIS measuring device of claim 4, wherein the calculator of the characterization circuit is also configured to determine a state of charge and/or a state of health of the battery from the calculated impedance value of the battery.

6. The EIS measuring device of claim 1, wherein the first and second transistors are of a MOSFET type.

7. The EIS measuring device of claim 6, wherein the electronic circuit further comprises a control circuit configured to apply, when the first and second transistors are of opposite conductivity types, a single gate control signal on a gate of the first transistor and a gate of the second transistor, or to apply, when the first and second transistors are of a same conductivity type, a first gate control signal on the gate of the first transistor and a second gate control signal, which is complementary to the first gate control signal, on the gate of the second transistor.

8. The EIS measuring device of claim 7, wherein the single gate control signal is a PWM signal, or wherein the first and second gate control signals are PWM signals.

9. The EIS measuring device of claim 1, wherein the electrical energy storage circuit comprises at least one capacitor.

10. The EIS measuring device of claim 1, wherein the characterization circuit comprises a shunt resistor having a first terminal coupled to the electronic circuit and a second terminal configured to be coupled to the battery.

11. An EIS measuring method comprising:

coupling at least one cell of a battery to the EIS measuring device of claim 1;

configuring the electronic circuit of the EIS measuring device alternately in the first and second modes; and measuring a current circulating between the at least one cell of the battery and the electronic circuit and measuring the voltage at terminals of the at least one cell of the battery.

12. The EIS measuring method of claim 11, wherein:

the battery comprises several cells serially connected one to the other;

the voltage is measured at terminals of the battery; and wherein the current circulating between the battery and the electronic circuit corresponds to a current circulating through the several cells.

13. The EIS measuring method of claim 11, wherein:

the battery comprises several cells serially connected one to the other; and the EIS measuring method is applied successively to each cell of the battery.

* * * * *